United States Patent [19]
Wozniak, Jr. et al.

[11] Patent Number: 5,264,256
[45] Date of Patent: Nov. 23, 1993

[54] APPARATUS AND PROCESS FOR GLOW DISCHARGE COMPRISING SUBSTRATE TEMPERATURE CONTROL BY SHUTTER ADJUSTMENT

[75] Inventors: John J. Wozniak, Jr., Webster; Barry A. Lees, Fairport; John A. Appoloney, Rochester; Lloyd A. Relyea, Webster; L. John Potter, Marion; Frederick L. Kuhn, Macedon; Edwin R. Kuhn, Rochester, all of N.Y.

[73] Assignee: Xerox Corporation, Stamford, Conn.

[21] Appl. No.: 941,463

[22] Filed: Sep. 8, 1992

[51] Int. Cl.⁵ .................. C23C 14/02; C23C 14/24; C23C 16/50
[52] U.S. Cl. .................. 427/535; 427/569; 118/723 E; 118/725; 315/111.21; 315/111.81
[58] Field of Search ......... 118/723, 725, 726; 315/111.21, 111.81; 427/533, 535, 569, 578, 579

[56] References Cited

U.S. PATENT DOCUMENTS

| | | | |
|---|---|---|---|
| 3,845,739 | 11/1974 | Erhart et al. | 118/49.1 |
| 3,861,353 | 1/1975 | Erhart et al. | 118/49.1 |
| 3,907,650 | 9/1975 | Pinsler | 204/34 |
| 3,911,162 | 10/1975 | Erhart et al. | 427/39 |
| 3,914,126 | 10/1975 | Pinsler | 96/1.5 |
| 4,019,902 | 4/1977 | Leder et al. | 96/1.5 |
| 4,072,518 | 2/1978 | Leder | 96/1.5 |
| 4,099,969 | 7/1978 | Leder | |
| 4,152,747 | 5/1979 | Fisher | 361/229 |
| 4,310,614 | 1/1982 | Connell et al. | 430/271 |
| 4,557,993 | 12/1985 | Matyjakowski | 430/131 |
| 4,721,891 | 1/1988 | Krausse | 315/349 |
| 4,770,965 | 9/1988 | Fender et al. | 430/66 |
| 4,792,460 | 12/1988 | Chu et al. | 427/563 |
| 4,959,287 | 9/1990 | Pai et al. | 430/59 |
| 5,180,434 | 1/1993 | DiDio et al. | 118/723 X |

Primary Examiner—Brian E. Hearn
Assistant Examiner—Jonathan D. Baskin
Attorney, Agent, or Firm—Judith L. Byorick

[57] ABSTRACT

Disclosed is a method and apparatus for effecting glow discharge comprising an elongated electrically conductive glow bar electrode, means for applying a potential to the glow bar electrode, thereby generating ions, means for creating a flow of ions from the glow bar electrode to a second electrode, and a shield situated to block partially the flow of ions between the glow bar electrode and the second electrode, said shield having a plurality of apertures through which ions can flow between the glow bar electrode and the second electrode, each aperture having associated therewith at least one shutter, said shutters being capable of at least partially blocking the flow of ions through the apertures, each shutter individually movable to a plurality of positions to adjust the flow of ions through the apertures.

23 Claims, 5 Drawing Sheets

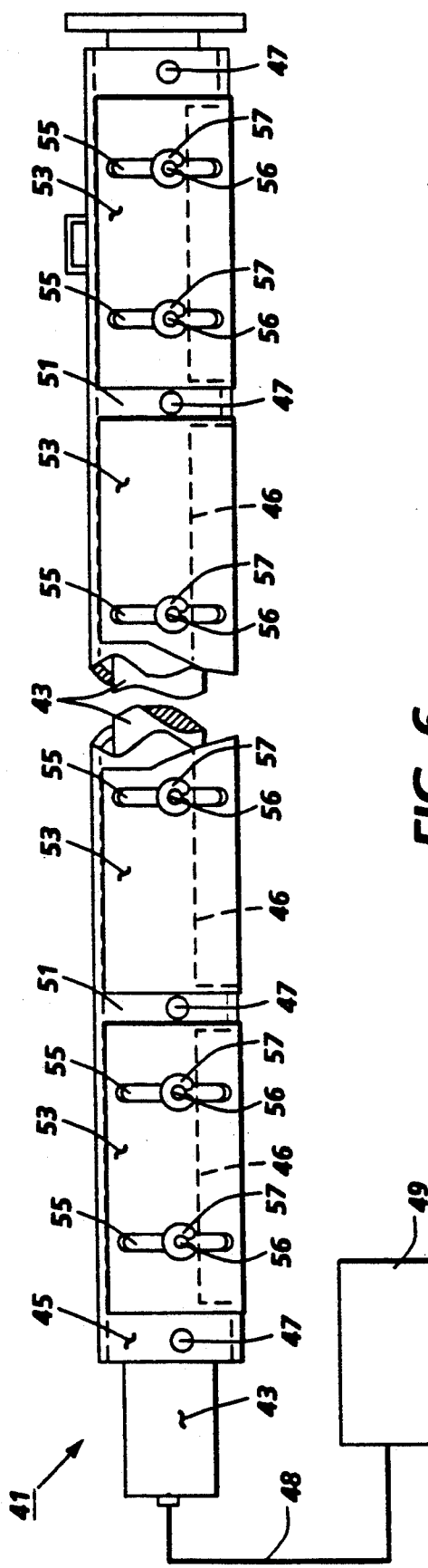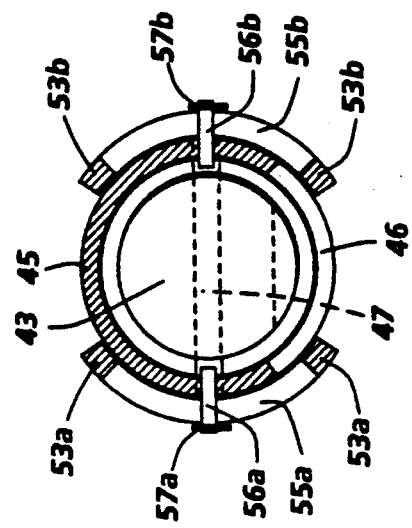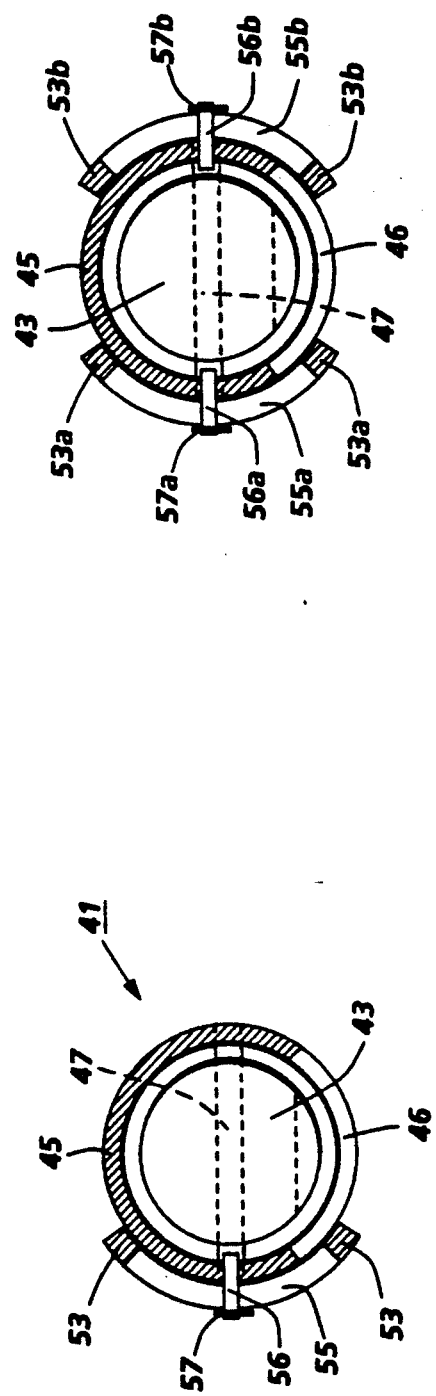

APPARATUS AND PROCESS FOR GLOW DISCHARGE COMPRISING SUBSTRATE TEMPERATURE CONTROL BY SHUTTER ADJUSTMENT

BACKGROUND OF THE INVENTION

The present invention is directed to an improved apparatus and process for effecting glow discharge. More specifically, the present invention is directed to an apparatus and process for uniformly generating a flow of ions between a glow bar electrode and one or more electroconductive substrates. One embodiment of the present invention is directed to an apparatus for effecting glow discharge comprising an elongated electrically conductive glow bar electrode, means for applying a potential to the glow bar electrode, thereby generating ions, means for creating a flow of ions from the glow bar electrode to a second electrode, and a shield situated to block partially the flow of ions between the glow bar electrode and the second electrode, said shield having a plurality of apertures through which ions can flow between the glow bar electrode and the second electrode, each aperture having associated therewith at least one shutter, said shutters being capable of at least partially blocking the flow of ions through the apertures, each shutter individually movable to a plurality of positions to adjust the flow of ions through the apertures. Another embodiment of the present invention is directed to a vacuum coating apparatus comprising (a) a vacuum chamber, (b) means for evacuating the vacuum chamber, (c) means for introducing gas into the vacuum chamber, (d) at least one mandrel member inside the vacuum chamber, upon which can be situated a plurality of electrically conductive substrates, and (e) at least one glow discharge apparatus comprising an elongated electrically conductive glow bar electrode, means for applying a potential to the glow bar electrode, thereby generating ions, means for creating a flow of ions from the glow bar electrode to the electrically conductive substrates, and a shield situated to block partially the flow of ions between the glow bar electrode and the electrically conductive substrates, said shield having a plurality of apertures through which ions can flow between the glow bar electrode and the electrically conductive substrates, each aperture having associated therewith at least one shutter, said shutters being capable of at least partially blocking the flow of ions through the apertures, each shutter individually movable to a plurality of positions to adjust the flow of ions through the apertures, wherein the number of apertures in each shield is equal to the number of substrates situated upon each mandrel. Yet another embodiment of the present invention is directed to a process for providing uniform ion bombardment of a plurality of electrically conductive substrates by a single glow discharge apparatus which comprises (a) providing a vacuum coating apparatus comprising (1) a vacuum chamber, (2) means for evacuating the vacuum chamber, (3) means for introducing gas into the vacuum chamber, (4) at least one mandrel member inside the vacuum chamber, upon each of which are situated a plurality of electrically conductive substrates, (5) means for measuring the temperature of each electrically conductive substrate on each mandrel, and (6) at least one glow discharge apparatus comprising an elongated electrically conductive glow bar electrode, means for applying a potential to the glow bar electrode, thereby generating ions, means for creating a flow of ions from the glow bar electrode to the electrically conductive substrates, and a shield situated to block partially the flow of ions generated between the glow bar electrode and the electrically conductive substrates, said shield having a plurality of apertures through which ions can flow between the glow bar electrode and the electrically conductive substrates, each aperture having associated therewith at least one shutter, said shutters being capable of at least partially blocking the flow of ions through the apertures, each shutter individually movable to a plurality of positions to adjust the flow of ions through the apertures, wherein the number of apertures in each shield is equal to the number of substrates situated upon each mandrel; (b) generating a partial vacuum within the vacuum chamber; (c) generating a flow of ions between the glow bar electrode and the electrically conductive substrates, thereby raising the temperatures of the electrically conductive substrates, (d) subsequent to step (c), measuring the temperatures of the electrically conductive substrates, (e) adjusting the positions of the shutters so that the flow of ions between the glow bar electrode and substrates having a temperature lower than a desired temperature is increased, (f) adjusting the positions of the shutters so that the flow of ions between the glow bar electrode and substrates having a surface temperature higher than a desired temperature is limited, and (g) repeating steps (c), (d), (e), and (f) until a desired degree of uniformity is achieved with respect to the temperatures of the electrically conductive substrates.

The use of glow discharge techniques is known in the fabrication of photoconductive imaging members. For example, U.S. Pat. No. 4,019,902 (Leder et al.), the disclosure of which is totally incorporated herein by reference, disclosed a photoreceptor having improved flexibility comprising a metal- or metal-coated flexible substrate and an inorganic photoconductor layer in charge blocking contact, the photoreceptor being obtained by initially bombarding the metal substrate, as cathode, with positive ions of an inert gas of low ionization potential under glow discharge in the presence of oxygen, and exposing the resulting oxidecoated substrate to a vapor cloud of photoconductor material consisting essentially of charged and uncharged material in an electrical field, utilizing the metal substrate as a cathode and a donor of said vapor cloud of photoconductor material or container thereof as an anode, the latter step being effected in combination with at least part of the initial bombardment step.

In addition, U.S. Pat. No. 3,914,126 (Pinsler), the disclosure of which is totally incorporated herein by reference, discloses a process for applying a photoconductive layer to a flexible nickel or nickel-coated substrate by initially subjecting a nickel sheet or belt to an acid etching bath followed by anodizing treatment in an electrolytic bath to obtain at least two intermediate metal oxide layers such as nickel oxide layers having superior adhesive and charge-injection-blocking characteristics. In addition, this references discloses that in addition to or as an alternative to the electrolyte treatment, a nickel oxide layer can be laid on the substrate by glow discharge techniques, wherein the nickel substrate is made the anode under partial vacuum with a current density of about $3 \times 10^{-5}$ A/cm$^2$ and a voltage (cathode) of about 2.5 kV for a period of about 1 to 5 minutes.

U.S. Pat. No. 3,907,650 (Pinsler), the disclosure of which is totally incorporated herein by reference, discloses a process for applying a photoconductive layer to a flexible nickel or nickel-coated substrate by initially subjecting a nickel sheet or belt to an acid etching bath followed by anodizing treatment in an electrolytic bath to obtain at least two intermediate metal oxide layers such as nickel oxide layers having superior adhesive and charge-injection-blocking characteristics. In addition, this references discloses that in addition to or as an alternative to the electrolyte treatment, a nickel oxide layer can be laid on the substrate by glow discharge techniques, wherein the nickel substrate is made the anode under partial vacuum with a current density of about $3 \times 10^{-5}$ A/cm$^2$ and a voltage (cathode) of about 2.5. kV for a period of about 1 to 5 minutes.

U.S. Pat. No. 4,959,287 (Pai et al.), the disclosure of which is totally incorporated herein by reference, discloses a xeroradiographic imaging member containing a substrate having an electrically conductive surface, an electroradiographic insulating layer selected from the group consisting of selenium and selenium alloys, and an overcoating layer containing nigrosine, a charge transport compound and a specific copolyester resin. The substrate, which is electrically conductive and of a material such as aluminum, titanium, nickel, chromium, brass, copper, zinc, silver, tin, or the like, can be cleaned and oxidized by glow discharge treatment of the substrate in a vacuum coater, wherein formation of the oxide layer can be closely monitored and controlled by regulation of the coater bleed gas flow rate with a precision flow gauge and valve, with pressure maintained between about 10 and about 100 micrometers of mercury, substrate temperature maintained at less than about 115° C. (240° F.), and flow rate sufficient to maintain a high oxygen content atmosphere (about 21 percent for air).

U.S. Pat. No. 4,770,965 (Fender et al.), the disclosure of which is totally incorporated herein by reference, discloses an electrophotographic imaging member comprising a conductive substrate, an alloy layer comprising selenium doped with arsenic having a thickness of between about 100 micrometers and about 400 micrometers, the alloy layer comprising between about 0.3 percent and about 2 percent by weight arsenic at the surface of the alloy layer facing away from the conductive substrate and comprising crystalline selenium having a thickness of from about 0.01 micrometer to about 1 micrometer contiguous to the conductive substrate, and a thin protective overcoating layer on the alloy layer, the overcoating layer having a thickness between about 0.05 micrometer and about 0.3 micrometer and comprising from about 0.5 percent to about 3 percent by weight nigrosine. The photoreceptor is prepared by providing a conductive substrate, cleaning the substrate, heating an alloy comprising selenium and from about 0.05 percent to about 2 percent by weight arsenic until from about 2 percent to about 90 percent by weight of the selenium in the alloy is crystallized, vacuum depositing the alloy on the substrate to form a vitreous photoconductive insulating layer having a thickness of between about 100 micrometers and about 400 micrometers containing between about 0.3 percent and about 2 percent by weight arsenic at the surface of the photoconductive insulating layer facing away from the conductive substrate, applying thin protective overcoating layer on the photoconductive insulating layer, the overcoating layer having a thickness between about 0.05 micrometer and about 0.3 micrometer and comprising from about 0.5 percent to about 3 percent by weight nigrosine, and heating the photoconductive insulating layer until only the selenium in the layer adjacent the substrate crystallizes to form a continuous substantially uniform crystalline layer having a thickness up to about one micrometer. The conductive substrate can be oxidized by exposure to glow discharge treatment in the vacuum coater, wherein formation of the oxide layer can be closely monitored and controlled by regulation of the coater bleed gas flow rate with a precision flow gauge and valve, with pressure maintained between about 10 and about 100 micrometers of mercury, substrate temperature maintained at less than about 115° C. (240° F.), and flow rate sufficient to maintain a high oxygen content atmosphere (about 21 percent for air).

U.S. Pat. No. 4,557,993 (Matyjakowski), the disclosure of which is totally incorporated herein by reference, discloses a process for preparing an electrophotographic imaging member comprising providing a nickel substrate, heating the nickel substrate to a temperature of at least 260° C. in the presence of oxygen until a continuous layer of nickel oxide forms on the substrate, and depositing at least one photoconductive insulating layer on the continuous layer of nickel oxide. This patent also discloses the treatment of nickel substrates by glow discharge prior to deposition of a photoconductive layer thereon.

U.S. Pat. No. 4,310,614 (Connell et al.), the disclosure of which is totally incorporated herein by reference, discloses a process for deposition of continuous pin-hole free tellurium films with thickness to less than 150A on a suitable substrate by first pretreating the substrate prior to film deposition. Ion sputtering or bombardment of the substrate surface with an inert gas prior to tellurium evaporation creates a dense coverage of nucleation sites on the substrate, which improves the adhesiveness and resistance to abrasion and oxidation of the deposited film while providing very thin pinhole free films of uniform thickness and desired crystallite orientation.

U.S. Pat. No. 4,099,969 (Leder), the disclosure of which is totally incorporated herein by reference, discloses a photoreceptor having improved flexibility and durability comprising a metal- or metal-coated substrate and an inorganic photoconductor layer in charge blocking contact with the substrate, the photoreceptor being obtained by initially bombarding a grounded or floating substrate with electrons and non-metallic high energy ions in the presence of oxygen and exposing the resulting clean oxide-coated substrate to a vapor cloud of photoconductor material bombarded by electrons and non-metallic ions to form high energy ions, the vapor cloud being initially obtained by evaporation from a crucible in a coated under glow discharge conditions; the latter functional step being optionally effected in combination with at least part of the initial bombardment step.

U.S. Pat. No. 4,072,518 (Leder), the disclosure of which is totally incorporated herein by reference, discloses a one-step process, method and corresponding xerographic photoreceptor obtained thereby, having all or part of the hole generating layer in the trigonal form, the process being effected and the photoreceptor obtained through the use of a glow discharge and ionizable inert gas. If desired, the substrate can be cleaned and provided with a charge blocking layer by initial bombardment of the substrate as a cathode with positive ions of an inert non-metallic gas in a vacuum coater.

U.S. Pat. No. 3,845,739 (Erhart et al.), U.S. Pat. No. 3,861,353 (Erhart et al.), and U.S. Pat. No. 3,911,162 (Erhart et al.), the disclosures of each of which are totally incorporated herein by reference, discloses a method and apparatus for vapor depositing a thin film of material on image retention surface substrate bodies comprising the steps of positioning a plurality of substrate bodies on a plurality of elongated, horizontally extending support mandrels, rotating each of the mandrels about an associated longitudinal axis thereof while simultaneously transporting the plurality of mandrels in an annular path about a horizontal axis, establishing an evacuated atmosphere about the assembly of mandrels, and vaporizing a material which is positioned in a planar array of crucibles located within a path defined by the annular travel of the mandrels. In a specific embodiment, the substrate bodies are preheated by a plurality of glow bar assemblies. In addition to heating the rotating substrate bodies to the desired temperatures for the deposition of the photoconductor material, the glow bar assemblies in the case of certain substrate body materials, such as aluminum, establish an interface surface on the substrate support bodies. The establishment of this interface at a time immediately prior to the deposition of the photoconductor in an evacuated atmosphere results in an enhanced photoconductor characteristic over that provided by means wherein the interface is formed in an ancillary apparatus and then subjected to an additional time interval and handling under atmospheric conditions.

U.S. Pat. No. 4,152,747 (Fisher), the disclosure of which is totally incorporated herein by reference, discloses an electrode which has at least one internal channel and an adjustable gate or slot to permit passage of gaseous material to be ionized from the internal channel and then in proximity to one or more outside faces of the electrode in a suitable area of electron emission, the electrode being placed in an electrical field in convenient proximity to an electrode or body of opposite charge. The apparatus is suitable for preparing electrophotographic photoconductors.

The use of glow discharge techniques is also disclosed in U.S. Pat. No. 3,914,126, U.S. Pat. No. 3,907,650, and in Ignatov, *J. Chimie Physique*, 54, pages 96 et seq. (1957), the disclosures of each of which are totally incorporated herein by reference.

While known apparatus and processes for treating photoreceptor substrates by glow discharge techniques are suitable for their intended purposes, a need remains for improved methods and apparatus for treating conductive imaging member substrates for the purposes of heating and/or cleaning, and, in some instances, for the purpose of oxidizing the substrate surface. In addition, there is a need for improved methods and apparatus for treating conductive materials such as plates, drums, belts, or the like by glow discharge. Further, a need remains for a method and apparatus for treating a plurality of substrates by glow discharge so that each substrate so treated is uniformly exposed to ion bombardment. Additionally, there is a need for a method and apparatus for treating a plurality of substrates by glow discharge wherein it is possible to control and vary the amount of glow plasma to which each substrate is exposed. By controlling the amount of glow plasma to which each substrate is exposed, the temperature variation between substrates can be controlled tightly, which enables efficient photoreceptor fabrication by vacuum evaporation techniques.

SUMMARY OF THE INVENTION

It is an object of the present invention to provide a method and apparatus with the above advantages.

It is another object of the present invention to provide an improved method and apparatus for treating conductive imaging member substrates.

It is yet another object of the present invention to provide a method and apparatus for treating conductive materials by glow discharge.

It is still another object of the present invention to provide a method and apparatus for treating a plurality of substrates by glow discharge so that each substrate so treated is uniformly exposed to ion bombardment.

Another object of the present invention is to provide a method and apparatus for treating a plurality of substrates by glow discharge wherein it is possible to control and vary the amount of glow plasma to which each substrate is exposed.

Yet another object of the present invention is to provide a method and apparatus for treating a plurality of substrates by glow discharge wherein the temperature variation between substrates is tightly controlled.

Still another object of the present invention is to provide a method and apparatus for treating photoreceptor substrates which enables efficient photoreceptor fabrication by vacuum evaporation techniques.

These and other objects of the present invention (or specific embodiments thereof) can be achieved by providing an apparatus for effecting glow discharge comprising an elongated electrically conductive glow bar electrode, means for applying a potential to the glow bar electrode, thereby generating ions, means for creating a flow of ions from the glow bar electrode to a second electrode, and a shield situated to block partially the flow of ions between the glow bar electrode and the second electrode, said shield having a plurality of apertures through which ions can flow between the glow bar electrode and the second electrode, each aperture having associated therewith at least one shutter, said shutters being capable of at least partially blocking the flow of ions through the apertures, each shutter individually movable to a plurality of positions to adjust the flow of ions through the apertures. Another embodiment of the present invention is directed to a vacuum coating apparatus comprising (a) a vacuum chamber, (b) means for evacuating the vacuum chamber, (c) means for introducing gas into the vacuum chamber, (d) at least one mandrel member inside the vacuum chamber, upon which can be situated a plurality of electrically conductive substrates, and (e) at least one glow discharge apparatus comprising an elongated electrically conductive glow bar electrode, means for applying a potential to the glow bar electrode, thereby generating ions, means for creating a flow of ions from the glow bar electrode to the electrically conductive substrates, and a shield situated to block partially the flow of ions between the glow bar electrode and the electrically conductive substrates, said shield having a plurality of apertures through which ions can flow between the glow bar electrode and the electrically conductive substrates, each aperture having associated therewith at least one shutter, said shutters being capable of at least partially blocking the flow of ions through the apertures, each shutter individually movable to a plurality of positions to adjust the flow of ions through the apertures, wherein the number of apertures in each shield is equal to the number of substrates situated upon each mandrel. Yet another embodiment of the present invention is directed to a process for providing uniform ion bombardment of a plurality of electrically conductive substrates by a single glow discharge apparatus which comprises (a) providing a vacuum coating apparatus comprising (1) a vacuum chamber, (2) means for evacuating the vacuum chamber, (3) means for introducing gas into the vacuum chamber, (4) at least one mandrel member inside the vacuum chamber, upon each of which are situated a plurality of electrically conductive substrates, (5) means for measuring the temperature of each electrically conductive substrate on each mandrel, and (6) at least one glow discharge apparatus comprising an elongated electrically conductive glow bar electrode, means for applying a potential to the glow bar electrode, thereby generating ions, means for creating a flow of ions from the glow bar electrode to the electrically conductive substrates, and a shield situated to block partially the flow of ions generated between the glow bar electrode and the electrically conductive substrates, said shield having a plurality of apertures through which ions can flow between the glow bar electrode and the electrically conductive substrates, each aperture having associated therewith at least one shutter, said shutters being capable of at least partially blocking the flow of ions through the apertures, each shutter individually movable to a plurality of positions to adjust the flow of ions through the apertures, wherein the number of apertures in each shield is equal to the number of substrates situated upon each mandrel; (b) generating a partial vacuum within the vacuum chamber; (c) generating a flow of ions between the glow bar electrode and the electrically conductive substrates, thereby raising the temperatures of the electrically conductive substrates, (d) subsequent to step (c), measuring the temperatures of the electrically conductive substrates, (e) adjusting the positions of the shutters so that the flow of ions between the glow bar electrode and substrates having a temperature lower than a desired temperature is increased, (f) adjusting the positions of the shutters so that the flow of ions between the glow bar electrode and substrates having a surface temperature higher than a desired temperature is decreased, and (g) repeating steps (c), (d), (e), and (f) until a desired degree of uniformity is achieved with respect to the temperatures of the electrically conductive substrates.

BRIEF DESCRIPTION OF THE DRAWINGS

FIG. 4 illustrates schematically a substrate bearing mandrels and a mask separating the mandrels.

FIGS. 5, 6, and 7 illustrate schematically one embodiment of the glow discharge assembly of the present invention.

FIG. 8 illustrates schematically another embodiment of the glow discharge assembly of the present invention.

The Figures contained herein are not necessarily drawn to scale.

DETAILED DESCRIPTION OF THE INVENTION

Figure 1:
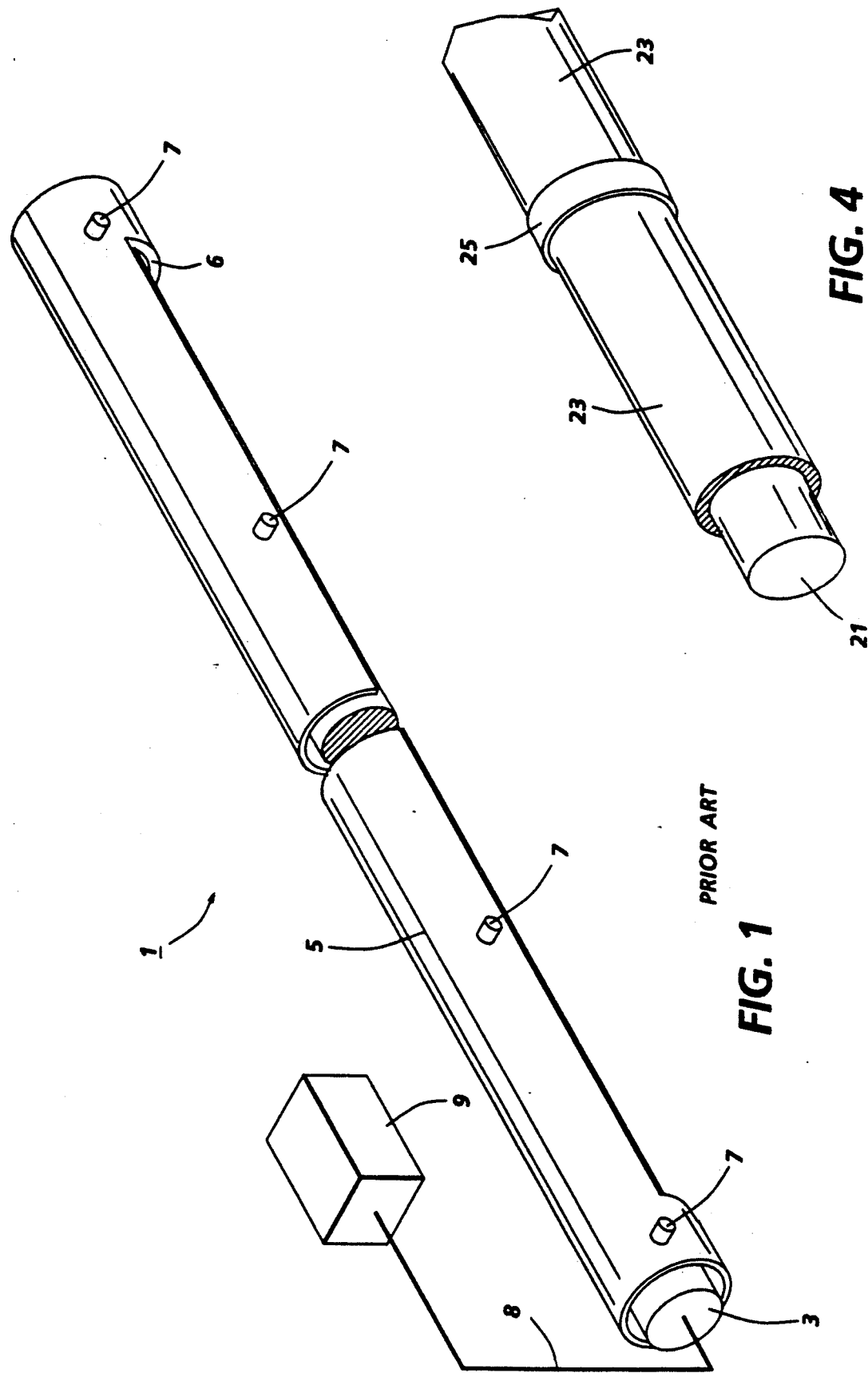
FIG. 1 illustrates schematically a glow discharge assembly of the prior art.

Known techniques for exposing conductive surfaces to glow discharge typically employ a glow plasma source as illustrated schematically in FIG. 1. As shown schematically in FIG. 1, glow discharge assembly 1 comprises an electrode 3 comprising an elongated, electrically conductive glow bar member and a shielding means 5 partially surrounding glow bar electrode 3, said shielding means functioning to shield and confine the glow discharge to the space immediately below the glow bar electrode 3. Electrode 3 is supported in and spaced from shield 5 by a plurality of electrically insulating spacers 7, which insulate the relatively high potential of the glow bar electrode from the shielding means 5. An electrical potential is applied to the glow bar electrode 3 through a lead 8 which is coupled to any additional glow bar electrodes which may be used in the glow discharge assembly through a vacuum sealed feed from power source 9. As illustrated in FIG. 1, shielding means 5 is a cylindrical tube partially surrounding a cylindrical glow bar electrode, although other configurations can include shielding means in oval, half-circle, rectangular, or other configurations and glow bar electrodes in rectangular, square, or other configurations. Shielding means 5 partially surrounds glow bar electrode 3 and is perforated with a single rectangular aperture 6, through which the glow plasma is directed toward the substrate (not shown) which is subjected to glow discharge.

Figure 2:
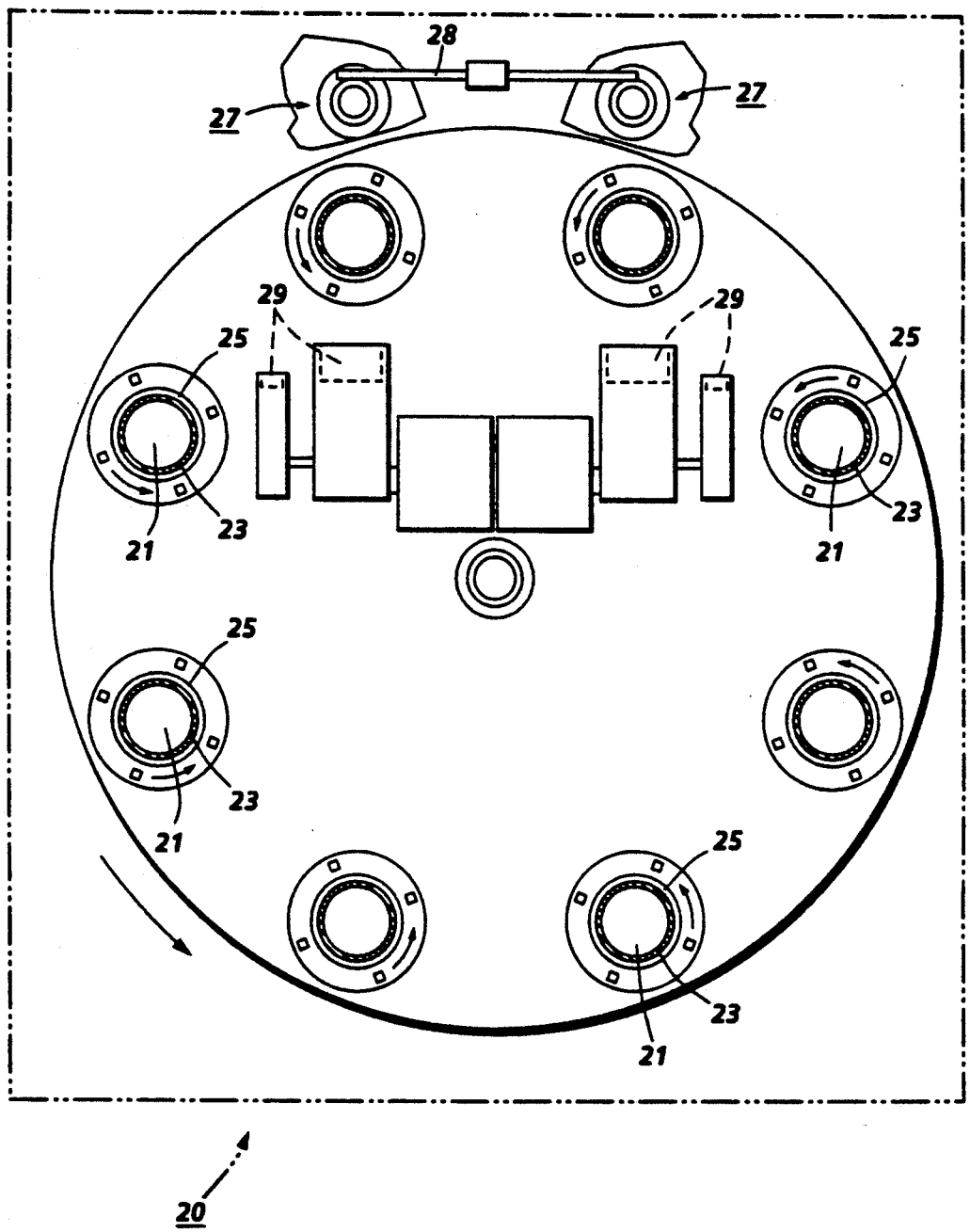
FIG. 2 illustrates schematically a planetary coating arrangement for exposing conductive substrates to glow discharge, optionally followed by vacuum evaporation of a photoconductive material onto the substrates.

Typical arrangements for exposing conductive photoreceptor substrates to glow discharge include planetary coaters, as disclosed in, for example, U.S. Pat. No. 3,845,739, the disclosure of which is totally incorporated herein by reference, and in-line coaters. A planetary arrangement is illustrated schematically in FIG. 2. As shown schematically in FIG. 2, a vacuum coating chamber 20 contains a plurality of mandrels 21 on each of which are situated one or more substrates 23. As illustrated in FIG. 2, mandrels 21 and substrates 23 are cylindrical, with substrates 23 being separated from each other by masks 25 when two or more substrates are situated on a mandrel. The masks 25 preferably are "T" shaped in cross-section, and thus both separate the substrates from each other and provide for an uncoated edge area on each substrate during the coating process. Another view of a mandrel 21, substrates 23, and a mask 25 is shown schematically in FIG. 4. Each mandrel 23 rotates in the direction of the arrows, and the assembly of mandrels revolves in the direction of the arrow around a central area within the vacuum coating chamber. Glow discharge assemblies 27 are mounted on supports 28 parallel to mandrels 21 and are stationary throughout the coating process. The glow discharge assemblies can be situated outside the diameter of the revolving series of mandrels, as illustrated schematically in FIG. 2, or inside the diameter of the revolving series of mandrels, as illustrated schematically in FIG. 6 of U.S. Pat. No. 3,845,739. Each substrate is exposed to glow discharge as it rotates on the mandrel and as the mandrels revolve within the vacuum coating chamber. Subsequent to initial heating, cleaning, and possible oxidation of the substrates via exposure to the glow plasma, a photoconductive material, such as selenium, an alloy of selenium and tellurium, an alloy of selenium and arsenic, an alloy of selenium, tellurium, and arsenic, or the like is vacuum evaporated onto the substrates from stationary crucible containers 29 situated within the central area of the vacuum coater while the mandrels rotate and the assembly of mandrels revolves around the central area.

Figure 3:
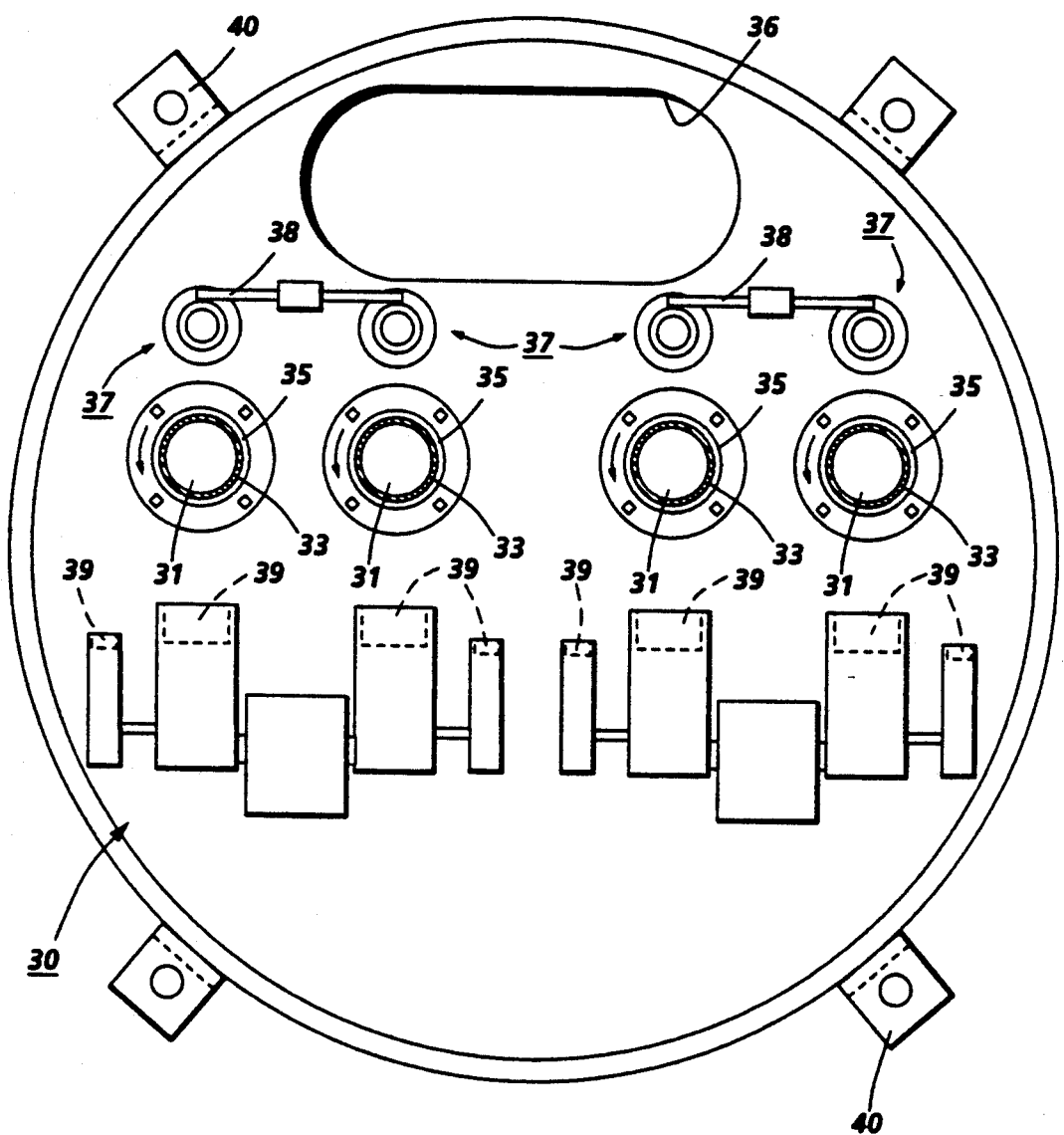
FIG. 3 illustrates schematically an in-line coating arrangement for exposing conductive substrates to glow discharge, optionally followed by vacuum evaporation of a photoconductive material onto the substrates.

An in-line arrangement is illustrated schematically in FIG. 3. As shown schematically in FIG. 3, a vacuum coating chamber 30 contains a plurality of mandrels 31 on each of which are situated one or more substrates 33. As illustrated in FIG. 3, mandrels 31 and substrates 33 are cylindrical, with substrates 33 being separated from each other by masks 35 when two or more substrates are situated on a mandrel. The masks 35 preferably are "T" shaped in cross-section, and thus both separate the substrates from each other and provide for an uncoated edge area on each substrate during the coating process. FIG. 4 illustrates schematically the arrangement of the substrates (numbered "23" in FIG. 4) and mask (numbered "25" in FIG. 4) on the mandrel (numbered "21" in FIG. 4). Each mandrel 33 rotates in the direction of the arrows. The mandrels 31 are stationary and rotate in position within the vacuum chamber throughout the process; as shown in FIG. 3, rotating mandrels 31 are mounted on the rear wall of vacuum chamber 30. Glow discharge assemblies 37 are mounted on supports 38 parallel to mandrels 31 and are stationary throughout the coating process. Each substrate is exposed to glow discharge as it rotates on the mandrel. Subsequent to initial heating, cleaning, and possible oxidation of the substrates via exposure to the glow plasma, a photoconductive material, such as selenium, an alloy of selenium and tellurium, an alloy of selenium and arsenic, an alloy of selenium, tellurium, and arsenic, or the like is vacuum evaporated onto the substrates from stationary crucible containers 39 while the mandrels rotate. FIG. 3 also illustrates schematically a gas inlet/outlet port 36, for removing gases from the vacuum chamber and for introducing gases into the vacuum chamber, and fastening means 40 for closing vacuum chamber 30.

During glow discharge in known assemblies as illustrated schematically in FIG. 1, the shielding means, which typically is fabricated of a material such as aluminum, expands and contracts as a result of exposure to the glow plasma. The single rectangular aperture 6 through which the glow plasma is directed toward the substrates expands and contracts in an "hour glass" pattern; thus the width of the aperture varies along the length of the glow discharge assembly. Variation in the width of the aperture in the shielding means results in variation in the temperatures to which the substrates exposed to the glow plasma are raised. In areas where the aperture widens as a result of expansion and contraction of the shielding means, the substrates are relatively hotter, and in areas where the aperture narrows as a result of expansion and contraction of the shielding means, the substrates are relatively cooler. It is generally desirable to maintain the temperature of each substrate in the coating chamber as close as possible to the temperature of the other substrates in the coating chamber so that the resulting photoreceptors are as uniform as possible in their characteristics. In instances wherein the substrate is exposed to a temperature higher than desired, the resulting photoreceptor formed from that substrate can have a tendency to cause relatively large white spots, or powder deficiency spots, on copies or prints made with that photoreceptor. In instances wherein the substrate is exposed to a temperature lower than desired, the resulting photoreceptor formed from that substrate can have a tendency to cause relatively small microwhite spots, or washout, on copies or prints made with that photoreceptor.

When a glow discharge assembly as illustrated schematically in FIG. 1 is used in a planetary arrangement as shown schematically in FIG. 2, the variation in the width of the aperture in the shielding means can result in nonuniform conditions along the length of the mandrels. For example, if each mandrel contains six substrates, the surface temperatures of the six substrates after exposure to the glow plasma can vary considerably. Since the mandrels in a planetary arrangement also revolve around the central area of the coating chamber while the glow discharge assemblies remain stationary, photoreceptors formed in the same position on each mandrel will generally have very similar characteristics. For example, in a planetary arrangement with eight mandrels, each bearing six substrates, all eight photoreceptors made in this arrangement that were situated in the far left position on each mandrel can be expected to have similar characteristics. These eight photoreceptors, however, may not have characteristics similar to the eight that were fabricated on the far right position on each mandrel. Accordingly, of the 48 photoreceptors made during the process, some nonuniformity can be expected in their characteristics because of the nonuniform expansion and contraction of the shielding means.

When a glow discharge assembly as illustrated schematically in FIG. 1 is used in an in-line arrangement as shown schematically in FIG. 3, the variation in the width of the aperture in the shielding means can also result in nonuniform conditions along the length of the mandrels. In this instance, however, since both the mandrels and the glow discharge assemblies remain stationary, each photoreceptor formed can be expected to have characteristics somewhat different from the others as a result of the nonuniform expansion and contraction of the shielding means. For example, in an in-line arrangement with four mandrels, each bearing five substrates, and with four glow discharge assemblies, one situated above and parallel to each mandrel, the photoreceptor made in the far left position on one mandrel might very likely have a substrate which was exposed to either more or less of the glow plasma than the substrate of the photoreceptor made in the far left position on another mandrel. Accordingly, of the 20 photoreceptors made during the process, a significant degree of nonuniformity can be expected in their characteristics because of the nonuniform expansion and contraction of the shielding means.

Figure 5:
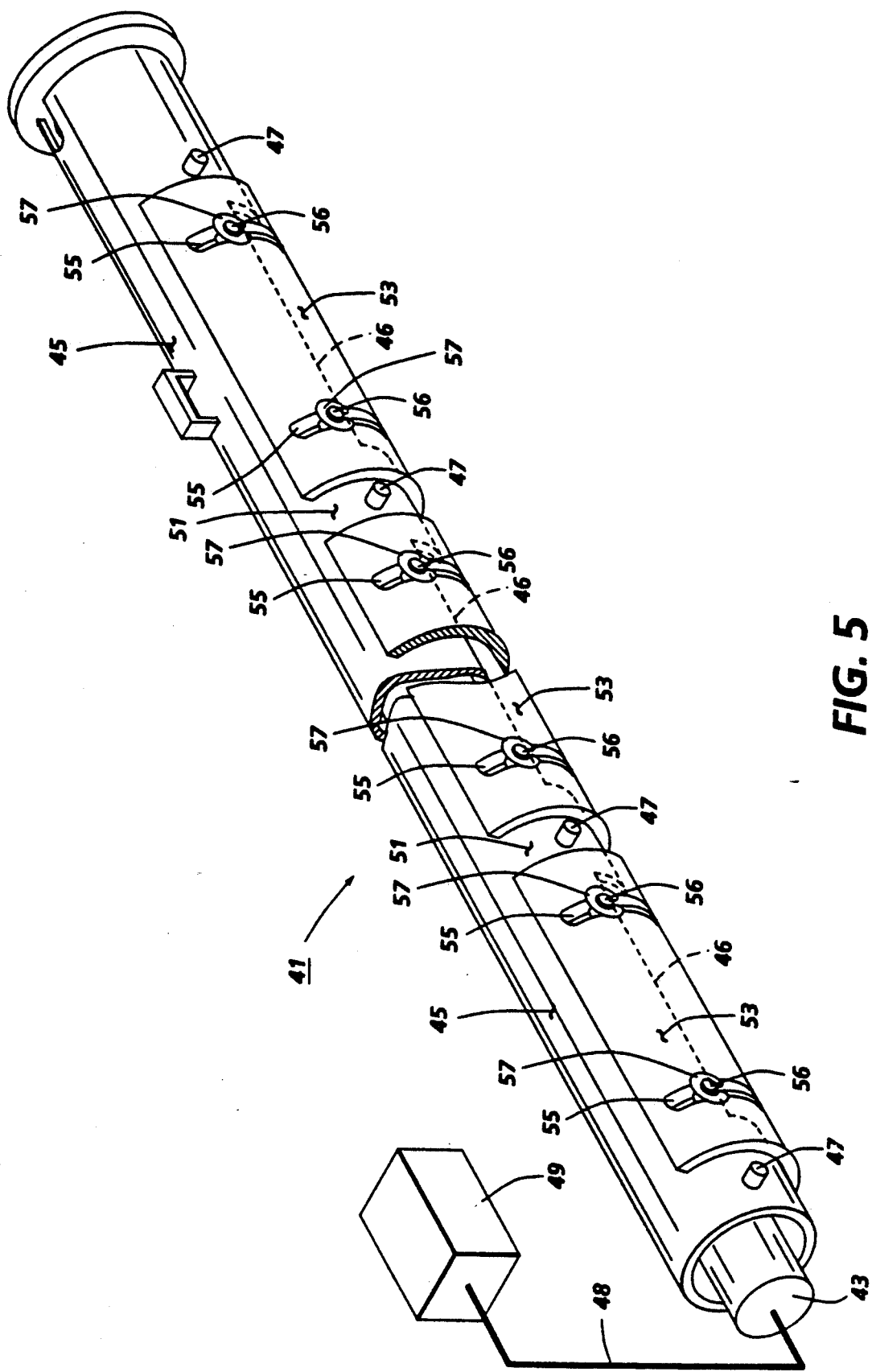

The glow discharge assembly of the present invention overcomes these difficulties. As illustrated schematically in FIGS. 5, 6, and 7, glow discharge assembly 41 comprises an electrode 43 comprising an elongated, electrically conductive glow bar member and a shielding means 45 partially surrounding glow bar electrode 43, said shielding means functioning to shield and confine the glow discharge to the space immediately below the glow bar electrode 43. Electrode 43 is supported in and spaced from shield 45 by a plurality of electrically insulating spacers 47, which insulate the relatively high potential of the glow bar electrode from the shielding means 45. An electrical potential is applied to the glow bar electrode 43 through a lead 48 which is coupled to any additional glow bar electrodes which may be used in the glow discharge assembly through a vacuum sealed feed from power source 49. As illustrated in FIGS. 5, 6, and 7, shielding means 45 is a cylindrical tube surrounding a cylindrical glow bar electrode, although other configurations can include shielding means in oval, half-circle, rectangular, or other configurations and glow bar electrodes in rectangular, square, or other configurations. Shielding means 45 partially surrounds glow bar electrode 43 and is perforated with a plurality of rectangular apertures 46, through which the glow plasma is directed toward the substrate (not shown) which is subjected to glow discharge. The number of apertures 46 corresponds to the number of substrates that will be situated on each mandrel, and the length (length being measured along the axis of the cylindrical shielding means in this instance) of each aperture 46 corresponds to a length equal to or less than the length of each substrate that will be situated on the mandrel or mandrels below the glow discharge assembly. Between apertures 46 are situated bridges 51, which generally are areas of the shielding means 45 which surround the glow bar electrode 43 continuously. Each aperture 46 is equipped with at least one shutter means 53 which at least initially is movable so that the distance between the edge of the shutter 53 and the edge of the corresponding aperture 46 can be adjusted. As illustrated in FIGS. 5, 6, and 7, for example, shutter means 53 is arc-shaped, with the degree of bend in the shutter being such that it fits snugly along the outer surface of cylindrical shielding means 45. When the shielding means is of another configuration, such as a rectangle, an oval, or any other suitable configuration, the shutter means likewise are of a shape appropriate to the shape of the shielding means. For example, when the shielding means is rectangular, the shutter means may be flat plates, or any other shape suitable to the particular arrangement selected. As illustrated schematically in FIGS. 5, 6, and 7, shutter means 53 are equipped with slots 55 and shielding means 45 is equipped with pins 56 so that the pins 56 fit within the slots 55 and the shutter means 53 can be slided open or closed over apertures 46.

The exact opening dimensions for each aperture can be adjusted by, for example, situating the glow discharge assembly adjacent to and parallel to a mandrel having substrates situated thereon. The temperature of each substrate during glow discharge can then be monitored by any suitable means, such as for example a thermocouple situated on the mandrel under each substrate, as illustrated in, for example, U.S. Pat. No. 3,861,353, the disclosure of which is totally incorporated herein by reference. By successive heating/monitoring and adjustment steps, each shutter means can be adjusted to the appropriate position for heating the corresponding substrate to the desired temperature. It is preferred that the temperature of each substrate be as close as possible to the desired temperature during glow discharge and that there be as little variation in temperature from one substrate to another. This temperature will vary according to many factors, such as substrate thickness, the material from which the substrate is made, the composition of the photoconductive material which will be applied to the substrate, and the like. In some instances, relatively wide temperature variations or ranges of, for example, from about 8° to about 20° F., and even up to about 30° F., between the temperature of the coolest and the temperature of the hottest substrate may be acceptable. In other instances, relatively narrow temperature variations or ranges of, for example, about 12° F. or less, and in some instances about 7° F. or less, between the temperature of the coolest and the temperature of the hottest substrate may be necessary to obtain photoreceptors which generate copies or prints with optimal image quality and no image defects.

During the adjustment period, shutter means 53 can be secured in place by any suitable means allowing for adjustment of the shutter position, such as spring clips or gripping rings 57 situated on the ends of pins 56 protruding through the outer surfaces of shutter means 53 through slots 55, or the like. If desired, once the desired shutter position has been determined, the shutter can be secured permanently in this position by any suitable means, such as by spot welding pins 56 to shutters 53, or the like.

Alternatively, as illustrated schematically in FIG. 8, a plurality of shutter means can be situated around each aperture 46. As shown schematically in FIG. 8, an aperture 46 in shielding means 45 is equipped with shutter means 53$a$ and 53$b$, adjustably mounted on shielding means 45 by pins 56$a$ and 56$b$ and slots 55$a$ and 55$b$ and secured by clips 57$a$ and 57$b$. Shutter means 53$a$ and 53$b$ can be adjusted as desired to control the amount of glow plasma exiting shielding means 45 as described herein with respect to FIGS. 5, 6, and 7. Glow bar electrode 43 is secured within shielding means 45 by insulating fasteners 47.

The shielding means and shutter means can be of any suitable material. Suitability in this instance includes relative mechanical stability of the shielding means at the temperatures to which it will be exposed during glow discharge, so that no substantial deformation of the shielding means occurs. When the glow discharge assembly is used in processes wherein photoreceptors are made by vacuum evaporation of a photoconductive material onto substrates, the shielding means and shutter means should also be of a material that can be cleaned of vacuum evaporated photoconductive material by some suitable process, such as sand blasting or the like. Examples of suitable materials include aluminum, stainless steel, ceramic materials, such as Heanium TM, available from Heanium Industries, Scottsville, N.Y., and the like.

The glow bar electrode can be situated at any effective distance from the substrates. Typically, in an in-line arrangement, the surfaces of the glow bar electrodes are from about 2 to about 6 inches away from the surfaces of the substrates, and in a planetary arrangement, the surfaces of the glow bar electrodes are from about 3 to about 12 inches away from the surfaces of the substrates, although the distances can be outside these ranges.

Typically, a high negative potential is applied to the glow bar electrode from a high voltage power source, such as a DC power source. Any effective potential for generating a glow plasma between the glow bar and the substrate to be subjected to ion bombardment is suitable; typical applied potentials are from about 0.4 to about 3 kilovolts, preferably from about 0.5 to about 2.5 kilovolts, and more preferably from about 1.5 to about 2.3 kilovolts, although the potential can be outside these ranges. The applied current generally varies according to factors such as the surface area, density, and size of the glow bar electrode (with wider diameter glow bars requiring higher current levels), the pressure within the vacuum chamber, and the distance between the glow bar and the substrate. Typical currents are from about 0.1 to about 1.5 amps when the voltage is within the above ranges and the pressure within the coating chamber is from about 20 to about 50 microns of mercury, although the current can be outside this range. The level of current can be observed and recorded to determine the effectiveness of the heat (Watts) being generated, which informs the operator whether the glow parameters are within a desired range. In a preferred embodiment, the glow plasma is generated by applying a negative voltage to the glow bar electrode, with the positive lead of the power source grounded and connected to the vacuum chamber and with the second electrode (or substrate) being in electrical contact with the positive, grounded vacuum chamber. Application of potential to the glow bar electrode thus generates electrons and negative ions which are attracted to the relatively positive substrates, resulting in heating of the substrates by kinetic energy.

A partial vacuum is created in the vacuum chamber. Typically, the pressure within the vacuum chamber is at least 20 microns of mercury, preferably from about 30 to about 70 microns of mercury, and more preferably from about 40 to about 45 microns of mercury, although the pressure can be outside these ranges. The pressure within the vacuum chamber is maintained by allowing a small amount of air to bleed into the chamber, thereby preventing the pressure from becoming undesirably low to a degree where a glow plasma cannot be generated. Ordinary atmospheric air is adequate for this purpose, although other gases, such as argon, nitrogen, oxygen, or the like can also be employed.

The glow discharge assembly of the present invention enables relatively narrow temperature range variations among the substrates heated thereby. With glow discharge assemblies as illustrated schematically in FIG. 1, for example, typically the narrowest range of temperatures between the coolest substrate and the hottest substrate which can be achieved is from about 10° to about 16° F., whereas with glow discharge assemblies of the present invention, temperature ranges between the coolest substrate and the hottest substrate of 12° F. or less, and in some instances of 7° F. or less, can be achieved.

The present invention also includes methods for making photoreceptors with the glow discharge assemblies of the present invention. The process entails adjusting the individual shutter positions as described herein so that the desired degree of heating uniformity among the substrates is achieved, optionally followed by replacing the substrates with new substrates which have not yet been subjected to ion bombardment, evacuating the chamber, and subjecting the new substrates to glow discharge with the apparatus of the present invention, and subsequently vacuum evaporating onto the substrates one or more layers of photoconductive material.

One class of photoconductive materials suitable for use with the present invention includes selenium and alloys of selenium. As employed herein, a selenium alloy is defined as an intermetallic compound of selenium with other elemental additives where the ratios of constituents are inconsistent with stoichiometric compositions. Photoconductive alloys of selenium are to be distinguished from stoichiometric compounds of selenium such as arsenic triselenide ($As_2Se_3$). Stoichiometric compounds of selenium such as arsenic triselenide appear to present less of a fractionation problem compared to alloys of selenium such as alloys of selenium and tellurium. Typical photoconductive alloys of selenium include selenium-tellurium, selenium-arsenic, selenium-tellurium-arsenic, selenium-tellurium-chlorine, selenium-arsenic-chlorine, selenium-tellurium-arsenic-chlorine alloys, and the like. For electrophotographic applications, any effective relative amounts of selenium and the alloying component or components can be selected. Typically, a selenium-tellurium alloy will comprise from about 5 to about 40 percent by weight tellurium and from about 60 to about 95 percent by weight selenium, although the relative amounts can be outside of this range. When a halogen dopant is present in the selenium-tellurium alloy, such as chlorine or iodine, the dopant is present in any effective amount, typically up to about 70 parts per million by weight for chlorine and up to about 140 parts per million by weight for iodine, although these amounts can be outside of the stated ranges. Typically, a selenium-arsenic alloy will comprise from about 0.01 to about 35 percent by weight arsenic and from about 65 to about 99.99 percent by weight selenium, although the relative amounts can be outside of this range. When a halogen dopant is present in the selenium-arsenic alloy, such as chlorine or iodine, the dopant is present in any effective amount, typically up to about 200 parts per million by weight for chlorine and up to about 1,000 parts per million by weight for iodine, although these amounts can be outside of the stated ranges. Typically, a selenium-tellurium-arsenic alloy will comprise from about 5 to about 40 percent by weight tellurium, from about 0.1 to about 5 percent by weight arsenic, and from about 55 to about 94.9 percent by weight selenium. When a halogen dopant is present in the selenium-tellurium-arsenic alloy, such as chlorine or iodine, the dopant is present in any effective amount, typically up to about 200 parts per million by weight for chlorine and up to about 1,000 parts per million by weight for iodine, although these amounts can be outside of the stated ranges. The expressions "alloy of selenium" and "selenium alloy" are intended to include halogen doped alloys as well as alloys not doped with halogen.

Processes for making selenium or selenium alloy photoreceptors by vacuum evaporation are well known, as disclosed in, for example, U.S. Pat. No. 4,822,712, U.S. Pat. No. 4,842,973, U.S. Pat. No. 4,780,386, U.S. Pat. No. 5,002,734, U.S. Pat. No. 4,414,179, U.S. Pat. No. 4,986,941, U.S. Pat. No. 5,075,191, U.S. Pat. No. 5,084,301, U.S. Pat. No. 4,920,025, U.S. Pat. No. 5,075,191, U.S. Pat. No. 4,986,941, and U.S. Pat. No. 5,084,301, the disclosures of each of which are totally incorporated herein by reference.

The imaging members prepared by the process of the present invention can be selected for known imaging and printing processes as disclosed in, for example, U.S. Pat. No. 4,265,990, U.S. Pat. No. 4,544,618, U.S. Pat. No. 4,560,635, and U.S. Pat. No. 4,298,672, the disclosures of each of which are totally incorporated herein by reference.

Specific embodiments of the invention will now be described in detail. These examples are intended to be illustrative, and the invention is not limited to the materials, conditions, or process parameters set forth in these embodiments. All parts and percentages are by weight unless otherwise indicated.

EXAMPLE

Six aluminum drums each 3.3 inches in outer diameter, 13.25 inches in length, and 0.125 inch thick were mounted on three mandrels, with each mandrel bearing two aluminum drums side by side. The mandrels were equipped with thermocouple temperature measuring devices in contact with each drum. The mandrels were situated inside a vacuum chamber, which was evacuated to a pressure of 40 microns of mercury. The six aluminum drums were subjected to glow discharge with apparatus of the present invention, wherein three 6061-T6 aluminum glow bar electrodes 0.75 inches in diameter and 92.94 inches in length were positioned parallel to the three mandrels. A potential of 1.8 kilovolts was applied to the glow bars from a DC power source. The apertures in the 6062-T6 aluminum shields surrounding the glow bars (said shields being 1.375 inches in outer diameter, 1.250 inches in inner diameter, and 92.75 inches in length) corresponded in length to the length of the aluminum drums. The width of one aperture on each shield (corresponding to the "temperature variable" drum on the corresponding mandrel) was maintained constant in the wide-open position at a width of one and one-sixteenth inches. The width of the adjacent aperture on each shield corresponding to the "control" drum situated adjacent to the "temperature variable" drum on the corresponding mandrel was varied over a number of heating and cooling cycles by adjusting the position of the shutter over the aperture to narrow the aperture width, and the temperatures of the drums were monitored via the thermocouple devices. The drums were subjected to glow discharge until the three control drums were heated to a temperature of 195° F., after which the supply of potential to the glow bars was ceased. The temperatures of the "temperature variable" drums at the time the "control" drums attained a temperature of 195° F. were as shown in the table below, wherein each temperature value is an average value calculated from the three actual temperature values measured for the three "temperature variable" drums at the times the corresponding "control" drums were exposed at the indicated aperture width. The numerical temperature values represent the difference in degrees Fahrenheit between the "control" drums (at 195° F.) and the "temperature variable" drums, with positive numbers indicating that the "temperature variable" drums were cooler than the "control" drums and negative numbers indicating that the "temperature variable" drums were hotter than the "control" drums. The numerical aperture width values represent the number of inches that the shutters over the "control" drums were closed or narrowed from the wide-open position during the cycle.

| Aperture Width Closure (Inches) | Temperature Difference (°F.) |
| --- | --- |
| 0.04 | +2.5 |
| 0.08 | −3.6 |
| 0.20 | −11.2 |
| 0.28 | −28.7 |
| 0.36 | −39.5 |
| 0.44 | −36.9 |
| 0.50 | −80.9* |
| 0.70 | −54.9* |

These results, if plotted graphically, indicate an essentially linear relationship between (a) the varied aperture width over the "control" substrate heated to 195° F., and (b) the temperature rise observed for the "temperature variable" drum with the shutter in the wide-open position under the same glow discharge conditions. The relationship is linear up to a closure of 0.44 inch, after which the relationship appears to develop as an exponential curve. The temperature difference values for aperture width closure values of 0.50 and 0.70, which are marked with an asterisk in the table, are not actual measured values, but represent extrapolated values based on observing the rate of heating of both the control and the temperature variable drums when the aperture widths over the control drums were narrowed to the indicated values; the heating process was aborted before the actual temperature values could be measured because the relative rates of heating of the drums at these relatively narrow aperture widths indicated that if the process was continued until the control drums were at 195° C., the temperature variable drums would be at temperatures sufficiently hot to cause damage to the apparatus.

Other embodiments and modifications of the present invention may occur to those skilled in the art subsequent to a review of the information presented herein; these embodiments and modifications, as well as equivalents thereof, are also included within the scope of this invention.

What is claimed is:

1. An apparatus for effecting glow discharge comprising an elongated electrically conductive glow bar electrode, means for applying a potential to the glow bar electrode, thereby generating ions, means for creating a flow of ions from the glow bar electrode to a second electrode, and a shield situated to block partially the flow of ions between the glow bar electrode and the second electrode, said shield having a plurality of apertures through which ions can flow between the glow bar electrode and the second electrode, each aperture having associated therewith at least one shutter, said shutters being capable of at least partially blocking the flow of ions through the apertures, each shutter individually movable to a plurality of positions to adjust the flow of ions through the apertures.

2. An apparatus according to claim 1 wherein the shutters are slidably attached to the shield.

3. An apparatus according to claim 1 wherein each aperture has associated therewith one shutter.

4. An apparatus according to claim 1 wherein each aperture has associated therewith a plurality of shutters.

5. An apparatus according to claim 1 wherein the shield is substantially cylindrical.

6. An apparatus according to claim 1 wherein the shutters are slidably attached to the shield and the shutters are of a shape that conforms to the shield surface.

7. A vacuum coating apparatus comprising (a) a vacuum chamber, (b) means for evacuating the vacuum chamber, (c) means for introducing gas into the vacuum chamber, (d) at least one mandrel member inside the vacuum chamber, upon which can be situated a plurality of electrically conductive substrates, and (e) at least one glow discharge apparatus comprising an elongated electrically conductive glow bar electrode, means for applying a potential to the glow bar electrode, thereby generating ions, means for creating a flow of ions from the glow bar electrode to the electrically conductive substrates, and a shield situated to block partially the flow of ions between the glow bar electrode and the electrically conductive substrates, said shield having a plurality of apertures through which ions can flow between the glow bar electrode and the electrically conductive substrates, each aperture having associated therewith at least one shutter, said shutters being capable of at least partially blocking the flow of ions through the apertures, each shutter individually movable to a plurality of positions to adjust the flow of ions through the apertures, wherein the number of apertures in each shield is equal to the number of substrates situated upon each mandrel.

8. An apparatus according to claim 7 wherein the shutters are slidably attached to the shield.

9. An apparatus according to claim 7 wherein each aperture has associated therewith one shutter.

10. An apparatus according to claim 7 wherein each aperture has associated therewith a plurality of shutters.

11. An apparatus according to claim 7 wherein the shield is substantially cylindrical.

12. An apparatus according to claim 7 wherein the shutters are slidably attached to the shield and the shutters are of a shape that conforms to the shield surface.

13. An apparatus according to claim 7 wherein the substrates are substantially cylindrical and wherein the apparatus also comprises means for rotating the mandrels.

14. An apparatus according to claim 13 wherein each glow discharge apparatus is substantially parallel to at least one mandrel.

15. An apparatus according to claim 7 also comprising means for evaporating a photoconductive material onto the substrates.

16. An apparatus according to claim 7 wherein the apertures are of a length no greater than the length of the substrates.

17. An apparatus according to claim 7 wherein the mandrels also comprise means for measuring the temperature of each substrate situated thereon.

18. A process for providing uniform ion bombardment of a plurality of electrically conductive substrates by a single glow discharge apparatus which comprises (a) providing a vacuum coating apparatus comprising (1) a vacuum chamber, (2) means for evacuating the vacuum chamber, (3) means for introducing gas into the vacuum chamber, (4) at least one mandrel member inside the vacuum chamber, upon each of which are situated a plurality of electrically conductive substrates, (5) means for measuring the temperature of each electrically conductive substrate on each mandrel, and (6) at least one glow discharge apparatus comprising an elongated electrically conductive glow bar electrode, means for applying a potential to the glow bar electrode, thereby generating ions, means for creating a flow of ions from the glow bar electrode to the electrically conductive substrates, and a shield situated to block partially the flow of ions generated between the glow bar electrode and the electrically conductive substrates, said shield having a plurality of apertures through which ions can flow between the glow bar electrode and the electrically conductive substrates, each aperture having associated therewith at least one shutter, said shutters being capable of at least partially blocking the flow of ions through the apertures, each shutter individually movable to a plurality of positions to adjust the flow of ions through the apertures, wherein the number of apertures in each shield is equal to the number of substrates situated upon each mandrel; (b) generating a partial vacuum within the vacuum chamber; (c) generating a flow of ions between the glow bar electrode and the electrically conductive substrates, thereby raising the temperatures of the electrically conductive substrates, (d) subsequent to step (c), measuring the temperatures of the electrically conductive substrates, (e) adjusting the positions of the shutters so that the flow of ions between the glow bar electrode and substrates having a temperature lower than a desired temperature is increased, (f) adjusting the positions of the shutters so that the flow of ions between the glow bar electrode and substrates having a surface temperature higher than a desired temperature is limited, and (g) repeating steps (c), (d), (e), and (f) until a desired degree of uniformity is achieved with respect to the temperatures of the electrically conductive substrates.

19. A process according to claim 18 wherein the vacuum chamber is evacuated to a pressure of no less than about 20 microns of mercury.

20. A process according to claim 18 wherein the vacuum chamber is evacuated to a pressure of from about 30 to about 70 microns of mercury.

21. A process according to claim 18 wherein the flow of ions between the glow bar electrode and the electrically conductive substrates is generated by applying a potential of from about 0.4 to about 3 kilovolts to the glow bar electrode.

22. A process according to 18 wherein subsequent to achievement of the desired degree of uniformity with respect to the temperatures of the electrically conductive substrates, a photoconductive material is vacuum evaporated onto the substrates.

23. A process according to 18 wherein subsequent to achievement of the desired degree of uniformity with respect to the temperatures of the electrically conductive substrates, the substrates are removed from the mandrels and replaced with new substrates which have not yet been subjected to glow discharge, a partial vacuum is generated within the chamber, the new substrates are subjected to glow discharge, and subsequently a photoconductive material is vacuum evaporating onto the new substrates.

* * * * *